United States Patent
Marion

(10) Patent No.: US 6,639,928 B2
(45) Date of Patent: Oct. 28, 2003

(54) OPTIC DEVICE COMPRISING A PLURALITY OF RESONANT CAVITIES OF DIFFERENT LENGTHS ASSOCIATED WITH DIFFERENT WAVELENGTHS

(75) Inventor: Francois Marion, Saint Egreve (FR)

(73) Assignee: Commissariat a l'Energie Atomique - CEA, Paris (FR)

( * ) Notice: Subject to any disclaimer, the term of this patent is extended or adjusted under 35 U.S.C. 154(b) by 0 days.

(21) Appl. No.: 10/124,324

(22) Filed: Apr. 18, 2002

(65) Prior Publication Data

US 2002/0186737 A1 Dec. 12, 2002

(30) Foreign Application Priority Data

Apr. 25, 2001 (FR) .............................. 01 05571

(51) Int. Cl.[7] ................................. H01S 5/00
(52) U.S. Cl. ............................. 372/50; 372/50; 372/23; 372/108; 372/99
(58) Field of Search ............................. 372/50, 23, 108, 372/99

(56) References Cited

U.S. PATENT DOCUMENTS

| 5,446,752 | A | * | 8/1995 | Ackley et al. ................. 372/46 |
| 6,026,111 | A | * | 2/2000 | Jiang et al. .................... 372/96 |
| 6,122,109 | A | * | 9/2000 | Peake et al. ................. 359/620 |
| 6,122,417 | A | * | 9/2000 | Jayaraman et al. ........... 385/24 |
| 6,353,502 | B1 | * | 3/2002 | Marchant et al. ........... 359/626 |
| 6,404,797 | B1 | * | 6/2002 | Mooradian .................... 372/96 |
| 6,438,149 | B1 | * | 8/2002 | Tayebati et al. .............. 372/45 |

FOREIGN PATENT DOCUMENTS

| EP | 0 514 283 A2 | 11/1992 |
| WO | WO 97/40558 | 10/1997 |
| WO | WO 99/34484 | * 7/1999 |
| WO | WO 02/075879 A1 | * 2/2002 |
| WO | WO 01/013481 A1 | * 7/2002 |
| WO | WO 02/054546 A1 | * 7/2002 |
| WO | WO 02/075872 A1 | * 9/2002 |

OTHER PUBLICATIONS

Saito et al., "Uniform CW Operation of Multiple–Wavelength Vertical–Cavity Surface–Emitting Lasers Fabricated by Mask Molecular Beam Epitaxy", IEEE Photonics Technology Letters, vol. 8, No. 9, Sep. 1, 1996, pp1118–1120.
Popovic et al., "Technique for monolithic fabrication of microlens arrays", Applied Optics, 27 (1998) Apr. 1, No. 7, New York, NY, US, pp. 1281–1284.
Wada, "Ion–Beam Etching of InP and Its Application to the Fabrication of High Radiance InGaAsP/InP Light Emitting Diodes", Electrochemical Oxidation of HCOOH, vol. 131, No. 10, pp 2373–2380.

* cited by examiner

Primary Examiner—Paul Ip
Assistant Examiner—Delma R. Flores Ruiz
(74) Attorney, Agent, or Firm—Oliff & Berridge, PLC

(57) ABSTRACT

The device comprises several resonant cavities of different lengths, in order to emit over several different wavelengths, depending on the length of the corresponding cavity. Each resonant cavity comprises a convex cap, preferably hemispherical, of transparent material for the emitted wavelengths. The convex cap defines, at one end of the cavity, an excessive thickness, of length li, which enables to vary the length of the corresponding cavity. The caps are, preferably, obtained by remelting cakes of preset dimensions, for example of selenium, on the material forming the cavities.

14 Claims, 3 Drawing Sheets

OPTIC DEVICE COMPRISING A PLURALITY OF RESONANT CAVITIES OF DIFFERENT LENGTHS ASSOCIATED WITH DIFFERENT WAVELENGTHS

TECHNICAL FIELD OF THE INVENTION

The invention concerns an optic device comprising a plurality of resonant cavities of different lengths associated with different wavelengths.

STATE OF THE ART

Such a device is, for example, intended to build on a single optoelectronic chip, an array of multiple wavelength lasers of VCSEL (vertical cavity surface emitting laser) type.

In the prior art, the variation in length of the resonant cavities of VCSEL-type laser array has been obtained by various processes, notably by successive engraving processes of different heights (EP-A-949728), by micromechanic displacement of a membrane (U.S. Pat. No. 5771253) or by controlling the epitaxial growth thickness of each cavity (EP-A-1030420).

However, these techniques are complex, notably because they require a particular technological step for each cavity length.

OBJECT OF THE INVENTION

The aim of the invention is a device that does not exhibit the shortcomings of the previous devices.

According to the invention, this purpose is met in that each resonant cavity comprises a convex cap of preset thickness, of transparent material for said wavelengths, intended to determine the length of the related resonant cavity.

According to a development of the invention, the caps can be obtained by remelting cakes on the material forming the cavities.

The cakes have, preferably, different surfaces, in relation to the preset thickness of the corresponding cap.

BRIEF DESCRIPTION OF THE DRAWINGS

Other advantages and characteristics will appear more clearly from the following account of particular embodiments of the invention, given for not limiting exemplification purposes and represented on the appended drawings whereon.

DESCRIPTION OF DEFFERENT EMBODIMENTS

Figure 1:
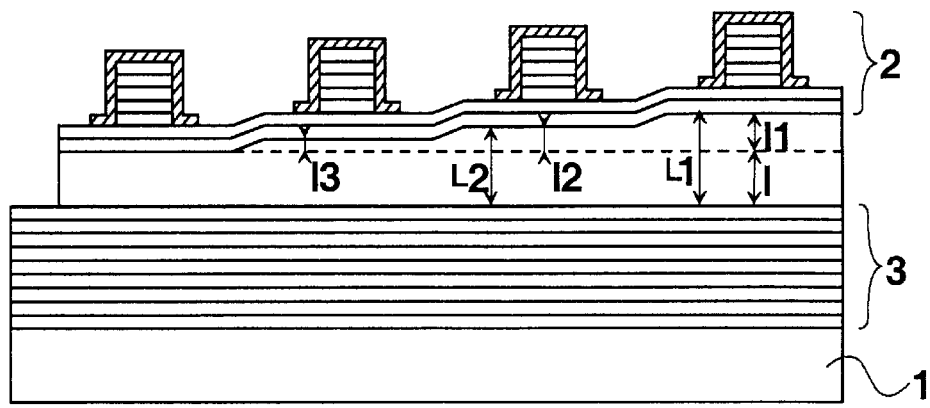
FIG. 1 is a schematic view of a device forming a laser array of type VECSEL according to the prior art.
Figure 1:
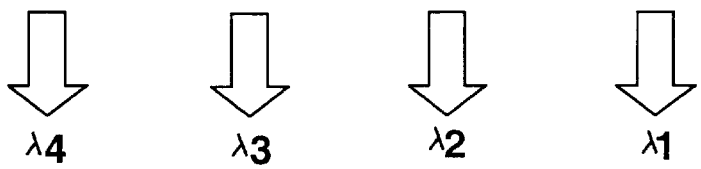

A known device forming a laser array of type VECSEL is illustrated on FIG. 1. It comprises 4 resonant laser cavities formed in a single optoelectronic chip 1. Each cavity is conventionally delineated by first and second mirrors 2 and 3, realised in the form of distributed Bragg's mirrors. The length L1, L2, L3 or L4, of each cavity is defined by the sum of a first length l, common to all cavities, and of a second length l1, l2 l3 or l4, different for each cavity. The variation of the second length is obtained by controlling the thickness of epitaxial growth of each cavity. On FIG. 1, the second lengths are decreasing from l1, to l4 and the length l4 is nil. Each cavity emits at a wavelength, respectively $\lambda 1$, $\lambda 2$, $\lambda 3$ or $\lambda 4$, depending on the length of the cavity.

Figure 2:
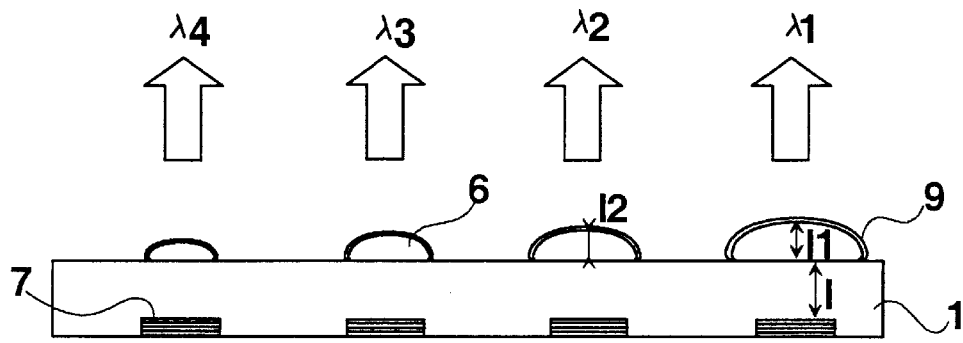
FIG. 2 is a schematic representation of device according to the invention.

A particular embodiment of a device according to the invention is represented schematically on FIG. 2. It comprises, as the device of FIG. 1, four resonant cavities of different lengths L1, L2, L3 or L4, with Li=l+li and i=1 to 4, in order to emit on four different wavelengths $\lambda 1$, $\lambda 2$, $\lambda 3$ or $\lambda 4$, depending on the length of the corresponding cavity.

On FIG. 2, each resonant cavity comprises a convex cap 6, preferably hemispherical, of transparent material for the wavelengths emitted. The convex cap 6 defines, at one end of the cavity, an excessive thickness corresponding to the length li, which enables to vary the length Li of the corresponding cavity.

Figure 3:
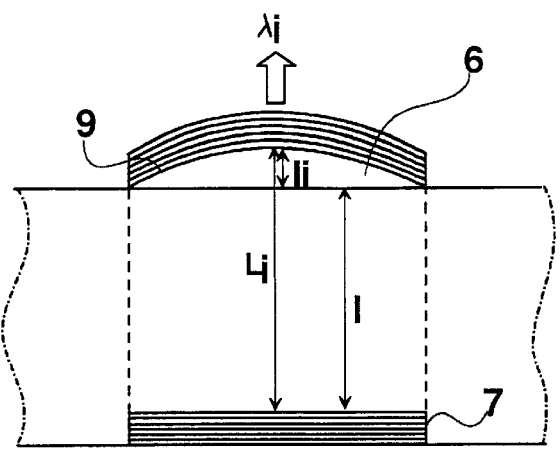
FIG. 3 represents, at enlarged scale, one of the resonant cavities of the device according to FIG. 2.

One of the resonant cavities of the device according to FIG. 2 is represented, at enlarged scale, on FIG. 3. The resonant cavity is delineated, at its lower section, by a Bragg's mirror 7, of reflectivity $R_1$, and at its upper section by another Bragg's mirror 9, of reflectivity $R_2$. An intermediate section of the resonant laser cavity, of length l identical for all the cavities of the device, is of conventional type and situated above the lower Bragg's mirror 7. According to the application contemplated, the mirrors 7 and 9 need not be Bragg's mirrors. One of the mirrors can, for example, be of metallic type and its reflectivity then practically of 100%.

A convex cap 6, of transparent material at the wavelengths to be emitted by the cavities, is formed above the intermediate section of the cavity, forming an excessive thickness corresponding to a preset $l_i$. The cavity has therefore a total length l+li. The mirror 9 is formed on the cap 6. The reflectivity $R_2$ of the mirror 9 being, on FIG. 3, supposedly smaller than the reflectivity $R_1$ of Bragg's mirror 7, the emission, at a wavelength $\lambda i$, is generated through the upper section of the cavity. In the reverse hypothesis, i.e. if $R_2 > R_1$, the emission is generated through the lower section.

In order to operate the array of cavities, said array is connected to an electronic control system 4 (FIGS. 4 and 5), of known type, to which it is conventionally connected by means of connection balls 5, of electrically conducting material. Other embodiments are also possible as, for example, a connection by the upper face or juxtaposition, by epitaxial lift off, by anisotropic conducting gluing, etc. . . .

Figure 4:
FIGS. 4 and 5 illustrate embodiment variations of a device comprising resonant cavities according to FIG. 3.
Figure 4:
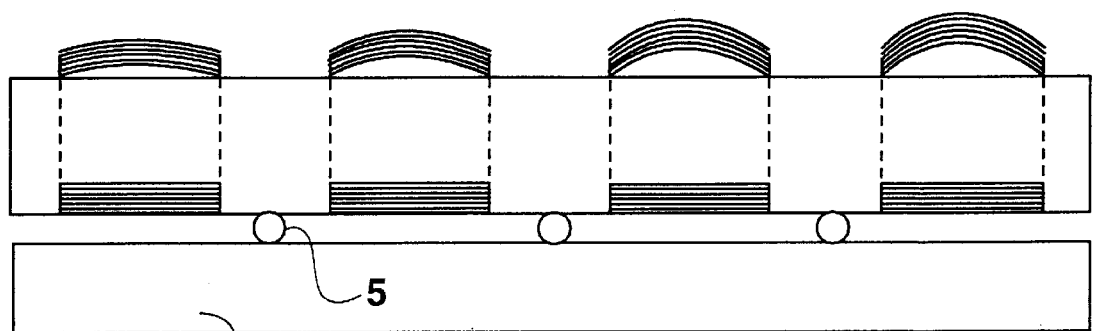

FIG. 4 corresponds to rear face hybridization. The emission must then be generated through the front face where the caps are, whereby this condition is essential: $R_2 < R_1$.

Figure 5:
Figure 5:
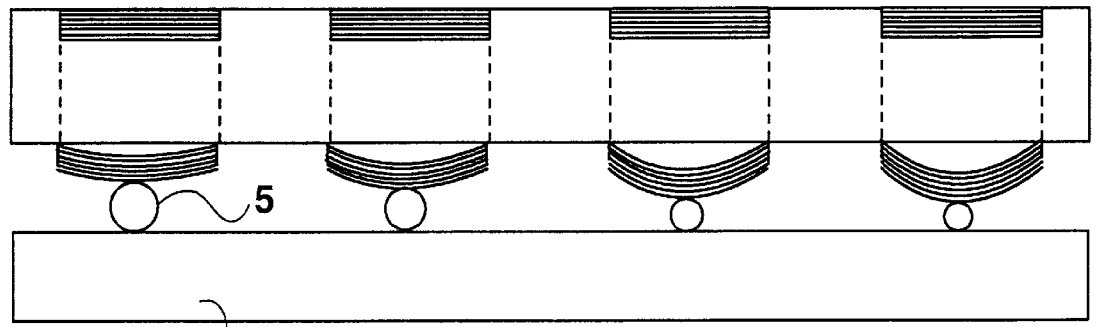

FIG. 5 corresponds to front face hybridization. The emission will be carried out through the rear face, whereby the condition to be met is $R_1 < R_2$.

Moreover, activation of cavities can be made conventionally by electric injection or by pumping.

The caps 6 can be formed by any appropriate means.

Figure 6:
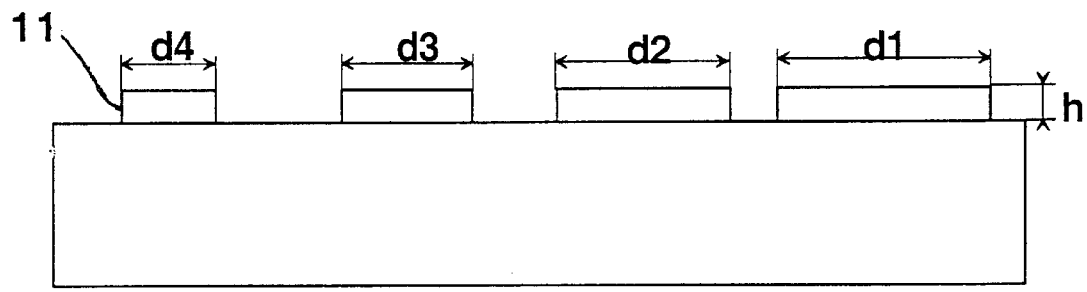
FIG. 6 illustrates a particular embodiment of caps of a device according to the invention, by remelting cakes.

In the preferred embodiment of the caps illustrated on FIG. 6, the caps are realised by remelting cakes 11 deposited previously, by any appropriate means on the material forming the cavities. The cakes 11, and consequently the caps 6, are, preferably, of selenium, the material forming the cavities being, conventionally, gallium arsenide (AsGa), indium phosphide (InP), silicium (Si) or one of their derivates. Selenium is advantageously transparent to the wavelengths used and has a melting point close to 200° C., compatible with the technologies used. Moreover, it adheres over the whole surface of the support, notably in the case of a support of gallium arsenide (AsGa). As no opaque wetting material is interposed between both materials, the element obtained is transparent.

Each cake 11 has preset dimensions, in relation to the requested thickness of the corresponding cap. On FIG. 6, all the cakes 11, whereof the base is of circular section, have the same thickness h, but different diameters d1, d2, d3 or d4. The assembly is then heated to sufficient temperature to melt the cakes 11, which take on the shape of hemispheric caps 6. Thanks to the adhesion strengths existing between the material forming the cake and its support, the base of the cap thus formed reflects the base of the corresponding cake. The geometry of a cap (height, bending radius . . . ) is controlled perfectly and depends only on the initial volume of the corresponding cake, i.e. the product of the base surface of the cake by its thickness h.

For exemplification purposes, the following wavelengths have been obtained with caps formed out of cakes 11 of selenium, of circular section and constant thickness h=0,2 $\mu$m:

| Diameter of the cake | 10 $\mu$m | 12 $\mu$m | 14 $\mu$m | 18 $\mu$m |
|---|---|---|---|---|
| Wavelength | $\lambda_0$ | $\lambda_0$ + 0.5 nm | $\lambda_0$ + 1 nm | $\lambda_0$ + 1.5 nm |

The differences obtained for the thicknesses of the caps are sufficient to enable great variability of the emission wavelength of a resonant cavity comprising such caps.

The base of the cakes need not be circular, but can be of any shape, in relation to the requested shape of the caps. For exemplification purposes, the base of the cakes can also be square, rectangular or oblong.

Besides, the cakes can also be made in the same material as that forming the cavities as in a different material. The materials are selected to provide an adhesion strength in contact with the cakes and their support when the cakes are deposited or after annealing. For exemplification purposes, the material used for the formation of the caps can also be, according to the requested variations of wavelengths, $As_2S_3$ or $As_2Se_3$ for wavelengths in the order of the micrometer, or also glasses for wavelengths in the order of the visible.

After remelting cakes 11 to form the caps 6, the device is completed by depositing mirrors 9 on the caps. The mirrors 9 are, preferably, mirrors of dielectric type. For exemplification purposes, the dielectric layers can be formed of the following materials: SiO, SiN, $YF_3$, ZnS, $TiO_2$ . . . The mirrors 9 can also be of semi-conducting type and be made of GaAs, GaAlAs.

The arrangement of the concave mirror 9 on the cap 6 increases the spectral convergence of the wavelengths inside a resonant cavity, regardless whether the emissions takes place on the caps side (FIG. 4) or on the opposite side (FIG. 5).

It should also be noted that the caps 6 also play the part of microlenses when the device emits on the caps side (FIG. 4), causing spatial convergence of the output light beams.

In short, in the embodiment of FIG. 4, obtaining a device of VCSEL type may comprises the following successive steps:

a) Realisation of an optoelectronic chip 1 comprising, for each resonant cavity, an active zone and a Bragg's mirror 7.

b) Hybridization of that chip on an electronic control circuit 4, notably of silicium, when the chip emits through the face opposite the Bragg's mirror.

c) Slimming the chip down to a set thickness.

d) Deposit of different cakes 11, for example of selenium, of a preset respective diameter in relation to the requested lengths of the different resonant cavities of the device.

e) Melting the cakes 11 to form caps 6 of preset thicknesses.

f) Deposit of a second Bragg's mirror 9 on each of the caps 6.

Other realisation processes of the caps can be contemplated, for example by chemical or plasma engraving, of annealed resin, or also by melting a material deposited on a wettable surface, or by realisation of non-planar structures by depositing material in openings.

Figures 7, 8:
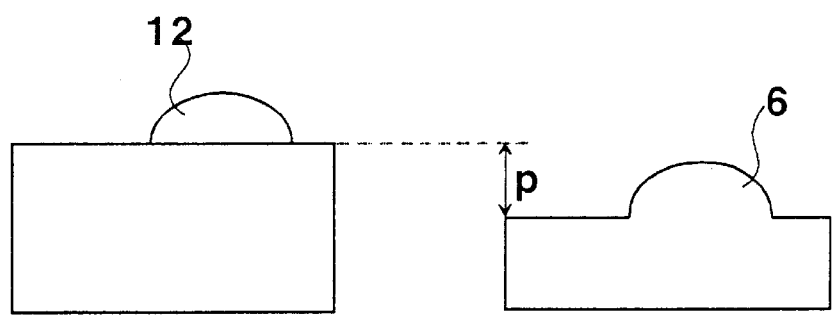
FIGS. 7 and 8 illustrate schematically two successive steps of another particular embodiment of caps of a device according to the invention, by simultaneous engraving of the material and of a resin layer.

FIGS. 7 and 8 illustrate schematically two successive steps of another particular embodiment of caps of a device according to the invention, by simultaneous engraving of the material and of a resin layer.

According to this type of method, already used in the prior art for the manufacture of microlenses, a photosensitive resin layer is deposited on a base material, for example of AsGa, and is then crept until a hemispherical shape 12 of requested dimensions is obtained. FIG. 7 illustrates this step of manufacture. The cap 6 is then realised in the base material, i.e. in the material forming the cavity, by an engraving process. The engraving process is a simultaneous anisotropic engraving of the base material and of the resin, at a preset depth p (FIG. 8) enabling to suppress totally the resin layer.

Unlike the embodiment of the caps made by remelting cakes (FIG. 6), the engraving technique according to FIGS. 7 and 8 exhibits as a shortcoming the incapacity for the base material of receiving active components at the surface comprising the caps.

In certain cases, a difficulty may be raised when the requested wavelength difference is small, for example less than 0.1 nm. Indeed, controlling the thickness of the initial cake must then be very accurate. A solution consists in using the known molecular jet epitaxy technique, which enables to control the deposit of materials with a precision smaller than 1 nm. The manufacturing steps may, for example, be as follows:

By molecular jet epitaxy (E.J.M.), deposit of the first mirror on a substrate, deposit of the material of the cavity, deposit of a barrier layer and deposit of a low melting point material.

By photolithography, realisation of cakes of variable size in the low melting point material (stopping the engraving process on the barrier layer).

Remelting cakes and forming caps of variable height.

Deposit of the second mirror.

Although the invention has been described above to form a laser of type VCSEL, it is not limited to that type of application. It may indeed be used in an array of optic transmitters formed of light-emitting diodes. It can also be used in a radiation detector enabling selection of different wavelengths. In such a device, the light entering through the caps 6 is amplified and detected in the different resonant cavities, which form wavelength selective elements.

What is claimed is:

1. An optic device comprising a plurality of resonant cavities of different lengths emitting and/or detecting at different corresponding wavelengths, wherein
    a plurality of first mirrors are located on a face of a common intermediate section having a constant thickness, each of the plurality of resonant cavities including one of the plurality of first mirrors,
    one of a plurality of solid, plano-convex caps, each having different thicknesses, is provided on an opposite face of the common intermediate section from each of a corresponding one of the plurality of first mirrors, said caps being made of a solid material transparent to said wavelengths,
    one of a plurality of second curved mirrors is provided on each of a corresponding one of the caps, and
    each one of the first mirrors and the corresponding one of the second mirrors delimit one of the plurality of resonant cavities, whereby a length of each of the plurality of resonant cavities is equal to the sum of the thickness of the intermediate section and the thickness of the corresponding cap.

2. A device according to claim 1, wherein the caps are hemispherical.

3. A device according to claim 1, wherein the caps are formed in the same material as that forming the cavities.

4. A device according to claim 3, wherein the material is of gallium arsenide, of indium phosphide or one of their derivates.

5. A device according to claim 1, wherein the caps are formed in a material different of the material forming the cavities.

6. A device according to claim 5, wherein the caps are of selenium.

7. A method for making an optical device according to claim 1, comprising:
    depositing a plurality of cakes on a chip comprised of the intermediate section and the plurality of first mirrors at a plurality of locations corresponding to locations of each of the plurality of first mirrors;
    remelting the cakes to form the plurality of caps; and
    depositing one of the plurality of second curved mirrors on each of the corresponding one of the caps.

8. A method according to claim 7, wherein the cakes have different volumes such that when the cakes are remelted, the cake having a given volume forms the cap having a height.

9. A device according to claim 1, wherein the plurality of second curved mirrors are dielectric mirrors.

10. A device according to claim 1, wherein the plurality of second curved mirrors are semi-conducting mirrors.

11. A device according to claim 1, wherein the device forms a laser array of type VCSEL.

12. A device according to claim 1, wherein the device forms an array of optic transmitters.

13. A device according to claim 1, wherein the device is a radiation detector, enabling selection of different wavelengths.

14. A method according to claim 8, wherein the cakes have a circular section and all the cakes have the same thickness but different diameters.

* * * * *